United States Patent
Pires

(10) Patent No.: US 10,608,596 B1
(45) Date of Patent: Mar. 31, 2020

(54) ANTI-CLIPPING PROTECTION IN AUDIO SYSTEMS

(71) Applicant: Stillwater Designs and Audio, Inc., Stillwater, OK (US)

(72) Inventor: Fernando Eid Pires, Stillwater, OK (US)

(73) Assignee: Stillwater Designs and Audio, inc., Stillwater, OK (US)

( * ) Notice: Subject to any disclaimer, the term of this patent is extended or adjusted under 35 U.S.C. 154(b) by 0 days.

(21) Appl. No.: 16/231,815

(22) Filed: Dec. 24, 2018

Related U.S. Application Data

(60) Provisional application No. 62/614,377, filed on Jan. 6, 2018.

(51) Int. Cl.
| | |
|---|---|
| H03F 1/52 | (2006.01) |
| H03F 1/30 | (2006.01) |
| H04R 3/00 | (2006.01) |
| H03F 3/181 | (2006.01) |

(52) U.S. Cl.
CPC .............. *H03F 1/52* (2013.01); *H03F 1/30* (2013.01); *H03F 3/181* (2013.01); *H04R 3/00* (2013.01); *H03F 2200/03* (2013.01); *H03F 2200/66* (2013.01)

(58) Field of Classification Search
CPC ... H03F 1/52; H03F 1/30; H03F 3/181; H03F 2200/03; H03F 2200/66; H03F 2200/258; H04R 3/00; H04R 3/02
USPC ................................. 381/107, 55, 94.1, 94.8
See application file for complete search history.

(56) References Cited

U.S. PATENT DOCUMENTS

| | | | | |
|---|---|---|---|---|
| 3,436,674 | A | * | 4/1969 | Plunkett .................. H03G 7/004 250/214 AG |
| 4,048,573 | A | * | 9/1977 | Evans ..................... H03G 3/301 330/2 |
| D305,333 | S | | 1/1990 | Irby |
| D307,015 | S | | 4/1990 | Irby |
| 4,978,926 | A | * | 12/1990 | Zerod .................. H03G 3/3026 330/279 |
| D355,193 | S | | 2/1995 | Irby |
| D449,293 | S | | 10/2001 | Irby et al. |
| D456,386 | S | | 4/2002 | Irby et al. |
| D473,216 | S | | 4/2003 | Irby et al. |
| 6,611,604 | B1 | | 8/2003 | Irby et al. |

(Continued)

FOREIGN PATENT DOCUMENTS

| | | |
|---|---|---|
| AU | 773216 B2 | 9/2004 |
| AU | 2004205159 | 8/2006 |

(Continued)

*Primary Examiner* — Ahmad F. Matar
*Assistant Examiner* — Sabrina Diaz
(74) *Attorney, Agent, or Firm* — Mary M. Lee

(57) ABSTRACT

An "anti-clipping" circuit for car audio systems. The circuit reduces the input voltage from a signal source to an analog-to-digital converter by using a divider or by scaling the output of the pre-amplifier to less than the saturation voltage of the ADC. A digital signal processor (DSP) with a limiter algorithm ensures that the signal never exceeds a selected threshold. Then, a multiplying block in the DSP restores the signal to the original voltage level. The anti-clipping circuit protects the speakers from high total harmonic distortion ("THD") levels and from distortion during engine start-up. It can also be used for thermal power rollback.

10 Claims, 1 Drawing Sheet

(56) References Cited

U.S. PATENT DOCUMENTS

| | | |
|---|---|---|
| 6,731,773 B1 | 5/2004 | Bergbower et al. |
| 6,760,452 B2 * | 7/2004 | Lau .................. H03G 7/002 |
| | | 333/14 |
| 6,968,069 B1 | 11/2005 | Zhao |
| 7,916,890 B2 | 3/2011 | Irby et al. |
| 3,023,688 A1 | 9/2011 | Irby et al. |
| 9,154,101 B2 * | 10/2015 | Dhuyvetter .......... H03G 11/002 |
| D783,577 S | 4/2017 | Ambrose et al. |
| D798,837 S | 10/2017 | Surratt et al. |
| D807,326 S | 1/2018 | Justis |
| D820,815 S | 6/2018 | Justis |
| 2003/0194104 A1 | 10/2003 | Irby et al. |
| 2008/0075318 A1 | 3/2008 | Zhao |
| 2008/0118098 A1 | 5/2008 | Irby et al. |

FOREIGN PATENT DOCUMENTS

| | | |
|---|---|---|
| CA | 2387939 | 9/2006 |
| CN | 101257733 | 8/2012 |
| EP | 1222839 | 7/2012 |
| ID | 018046 | 9/2006 |
| KR | 554818 | 2/2006 |
| MX | 227315 | 4/2005 |
| MY | 125083 | 7/2006 |
| SG | 87643 | 5/2005 |
| TH | 048559 | 3/2016 |
| TW | 498700 | 12/2002 |
| WO | 0131975 A2 | 5/2001 |

\* cited by examiner

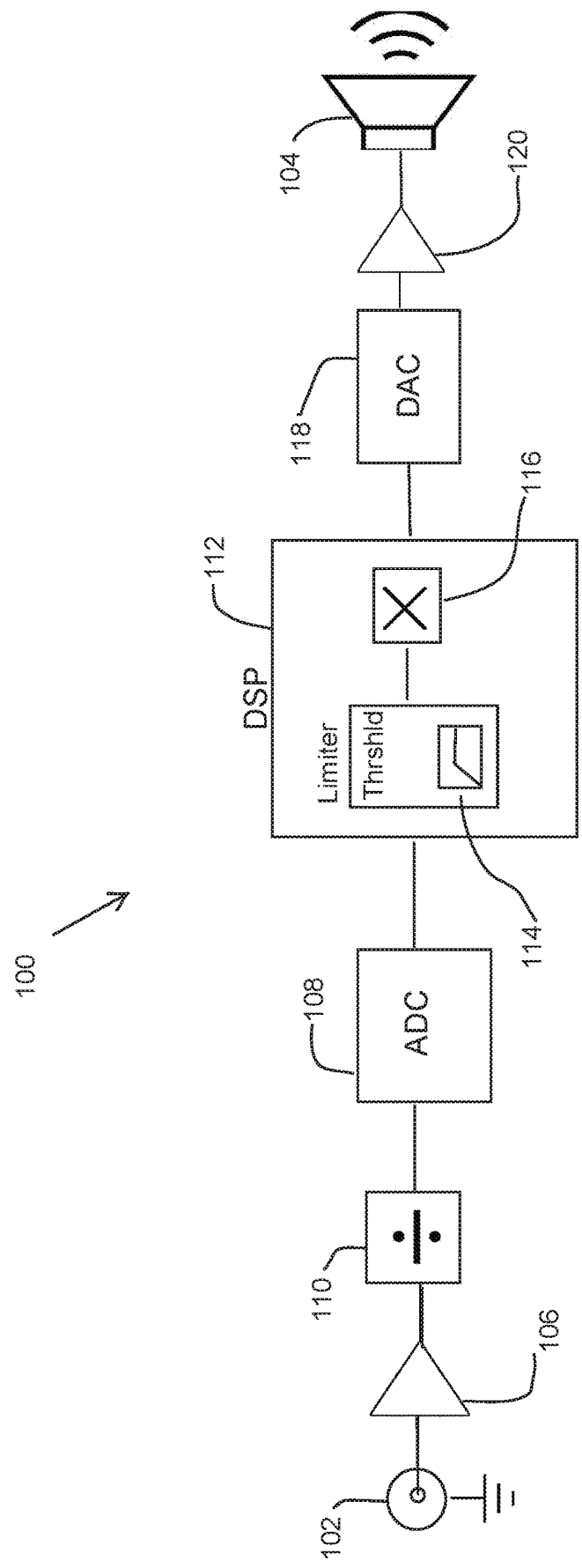

ANTI-CLIPPING PROTECTION IN AUDIO SYSTEMS

CROSS-REFERENCE TO RELATED APPLICATIONS

This application claims the benefit of U.S. provisional application No. 62/614,377 entitled "Anti-Clipping Protection in Audio Systems," filed Jan. 6, 2018, the contents of which are incorporated herein by reference.

FIELD OF THE INVENTION

The present invention relates to sound systems generally and, more particularly but without limitation, to sound systems in vehicles.

BRIEF DESCRIPTION OF THE DRAWINGS

The accompanying drawing, which is incorporated into and forms a part of the specification, illustrates one embodiment of the present invention and, together with this description, serves to explain the principles of the invention. The drawing merely illustrates an embodiment of the invention and is not to be construed as limiting the scope of the invention.

The drawing is a block diagram of a loud speaker system made in accordance with an embodiment of the present invention.

DETAILED DESCRIPTION OF THE PREFERRED EMBODIMENT(S)

In audio systems, "clipping" refers to a signal distortion usually resulting from overdriving an amplifier so that the sound waves output are cut off or "clipped" at their peaks. In conventional circuits, the signal source accepts a wide range of voltages. The audio circuit typically includes a pre-amplifier that conditions the signal to produce a "normalized" voltage level compatible with an analog-to-digital (ADC) converter. When the output level of the pre-amp and the input level of the ADC match, which is common, the ADC saturates, reaching its maximum input level and outputting its maximum digital number. By way of example, for a signed 24-bit ADC, the maximum digital output would be 8388607 (hexadecimal value=0x7FFFFF). From this point forward, hard clipping will inevitably occur. This is because the signal is clipped before it reaches the digital signal processor (DSP) and the amplifier section. The present invention provides a loud speaker system with an audio circuit that prevents clipping.

With reference now to the drawing, there is shown therein schematically a loudspeaker system made in accordance with a preferred embodiment of the present invention and designated generally by the reference number 100. Generally, the system 100 comprises a signal source 102 configured to receive an input and produce an output in the form of an analog audio signal. The system 100 further comprises a speaker 104 to reproduce sound in response to the audio signal, and a circuit to transmit the audio signal from the signal source to the speaker. The signal source 102 and the speaker 104 may be conventional devices and are not shown or described in detail in herein.

The signal source 102 outputs the audio signal to a pre-amplifier 106 for adjusting the signal voltage to a level compatible with the analog-to-digital converter (ADC) 108. Preferably, the circuit further includes a voltage reduction circuit 110 connected to receive the signal from the pre-amplifier 106 and configured to reduce or scale down the voltage of the analog signal by a selected factor before it is input to the ADC 108. In the embodiment illustrated, the voltage reduction circuit 110 comprises a voltage divider configured to receive the audio signal from the pre-amplifier 106 and to output the scaled signal to the ADC 108. For example, the voltage divider 110 may be configured with a 2:1 ratio; this provides an extra 6 dB "headroom" before the ADC 108 will clip the signal. Alternately, the output of the pre-amp 106 may be scaled to half of the saturation voltage of the ADC 108 as this would achieve the same effect. For example, the voltage reduction circuit 110 may include a scaling amplifier. Still further, the voltage reduction circuit 110 may be incorporated in the pre-amplifier 106.

The digital signal produced by the ADC 108 next is processed digitally in a digital signal processor (DSP) 112. The DSP 112 may be configured to perform one or more of several functions, such as volume control, equalization, generating user interface, and the like, in a known manner. Additionally, the DSP 112 of the inventive circuit may comprise a "limiter" algorithm at 114. A limiter algorithm is standard on many DSPs, such as the SigmaStudio brand DSP's (Analog Devices, Inc. of Norwood Mass.). The limiter algorithm 114 is included to prevent the signal from exceeding a selected threshold.

A multiplying block 116 may also be included in the DSP 112 after the limiter algorithm block 114 to increase the voltage to the level of the analog signal output from pre-amplifier 106, that is, the pre-scaled level. This signal is then output to the digital-to-analog converter (DAC) 118 and then to the main amplifier 120. Now it will be understood that the restored signal output from the DSP allows the main amplifier 120 to be driven to full power when outputting the signal to the speaker 104.

For example, if the voltage divider 110 in front of the ADC 108 is reducing the voltage by half, that is, has a ratio of 2:1, then the multiplier 116 inside the DSP 112 must be 2×. In this way, the voltage of the signal is halved and then doubled, restoring it to the voltage output by the preamplifier 106. If the hardware is properly designed, the main amplifier 120 will start to clip at around the maximum output of the DAC 118. Thus, for the exemplary 24-bit, the DSP 112 would have to output a signal reaching an amplitude represented digitally by 8388607 (hexadecimal value=0x7FFFFF).

Now it will be appreciated that the ADC 108 will never saturate before the limiter algorithm 114 starts compressing the signal. In this example with the 24-bit system, possessing a 2:1 divider and a 2× multiplier, the maximum input seen by the DSP 112 will be 4194303 (hexadecimal value=0x3FFFFF), which is a number that can be handled without overflowing the registers. The limiter algorithm 114 is triggered by a signal in excess of fifty percent (50%) (4194303 or 0x3FFFFF), preventing this value from going any higher, even though the actual voltage input may be varying to higher values that would overload conventional systems. Hence, as overloading the input does not cause a change in the value after the limiter algorithm 114, the signal can be doubled safely (in this example), thus restoring the full-scale output of 8388607 and driving the amplifier 120 at full power, but not clipping the signal.

Now it will be apparent that the anti-clipping circuit of the present invention offers advantages over the conventional systems as it allows for varying the threshold of the limiter according to other environmental variables, such as heatsink temperature and battery voltage. One example is an anti-clipping feature for start-stop in vehicles. During the engine cranking time, the input voltage to the amplifier drops dramatically, usually from about 13.5V to 9V or so. During this period the amplifier produces less that its nominal power. With this anti-clipping implementation, the limiter threshold can be reduced accordingly, limiting temporarily the signal to the main amplifier 120, preventing it from swinging its output beyond the temporarily reduced voltage rails, which in turn prevents clipping.

Another advantageous use of this feature is for "thermal power rollback." As an amplifier reaches and surpasses its maximum specified operational temperature (for example 75 degrees Celsius), it becomes less capable of producing power. If not shut down or rolled back, it can self-destruct. Usually amplifiers will simply shut down until the heatsink temperature drops enough to restart the operation. With the inventive anti-clipping circuit, the threshold of the limiter can be lowered as the temperature raises, thus limiting the power of the amplifier as the temperature rises. As the power is reduced, the temperature rises more slowly. Eventually the system achieves equilibrium when the temperature ceases to rise and the output power is not reduced any further. This is an advantageous "over temperature" protection function, as it does not cutoff the audio abruptly and it also does not output any clipped signal.

The embodiments shown and described above are exemplary. Many details are often found in the art and, therefore, many such details are neither shown nor described herein. It is not claimed that all of the details, parts, elements, or steps described and shown herein are newly invented. Where one such component is shown and described, it will be noted that this can be replaced by multiple components providing the same overall functionality, and similarly where functionality is shown distributed between different blocks for ease of illustration, this functionality can be provided in a single component, all within the principles of the invention to the full extent indicated by the broad meaning of the terms in the attached claims. The description and drawings of the specific embodiments herein do not point out what an infringement of this patent would be, but rather provide non-limiting examples of how to use and make the invention. Likewise, the abstract is neither intended to define the invention, which is measured by the claims, nor is it intended to be limiting as to the scope of the invention in any way. The limits of the invention and the bounds of the patent protection are measured by and defined in the following claims.

What is claimed is:

1. A circuit for a loudspeaker system comprising a signal source for generating an audio signal having a voltage and a speaker for producing sound, wherein the circuit is configured to transmit the audio signal from the signal source to the speaker to reproduce the audio signal, and wherein the circuit comprises:
   a pre-amplifier connectable to receive the audio signal from the audio signal source;
   a voltage scaling circuit connected to receive the audio signal from the pre-amplifier and configured to reduce the voltage of the audio signal by a selected factor to produce a scaled voltage;
   an analog-to-digital converter connected to receive the audio signal from the voltage scaling circuit and to output a digital audio signal;
   a digital signal processor comprising:
      a signal multiplier connected to receive the digital audio signal from the analog-to-digital converter and to multiply the digital audio signal by the selected factor employed by the voltage scaling circuit;
      a digital-to-analog converter connected to receive the digital audio signal from the signal multiplier of the digital signal processor and to output an analog audio signal; and
   a main amplifier connected to receive the analog audio signal from the digital-to-analog converter and to output the amplified analog audio signal to the speaker.

2. The circuit of claim 1 wherein the voltage scaling circuit comprises a voltage divider connected to receive the audio signal from the pre-amplifier and to output the scaled voltage to the analog-to-digital converter.

3. The circuit of claim 1 wherein the voltage scaling circuit comprises a scaling amplifier to receive the audio signal from the pre-amplifier and to output the scaled voltage to the analog-to-digital converter.

4. The circuit of claim 3 wherein the analog-to-digital converter has a saturation voltage and wherein the scaling amplifier is configured to output a scaled audio signal scaled to one-half the saturation voltage of the analog-to-digital converter.

5. The circuit of claim 1 wherein the voltage scaling circuit is incorporated into the pre-amplifier.

6. The circuit of claim 1 wherein the digital signal processor further comprises a limiter connected to receive the digital audio signal from the analog-to-digital converter and to output the digital audio signal to the signal multiplier.

7. A loudspeaker system comprising a signal source, a speaker, and the circuit of claim 1.

8. A method for transmitting an audio signal in a loudspeaker system comprising a signal source, a pre-amplifier connected to receive an analog audio signal having a voltage from the signal source, a main amplifier, and a speaker connected to receive the output of the main amplifier, the method comprising:
   reducing by a selected factor the voltage of the analog audio signal produced by the pre-amplifier to generate a reduced analog audio signal;
   converting the reduced analog audio signal to a reduced digital audio signal;
   digitally processing the reduced digital audio signal, the digital processing including increasing the voltage of the reduced digital audio signal by the selected factor to produce a restored digital audio signal;
   converting the restored digital audio signal to a restored analog audio signal; and
   inputting the restored analog audio signal to the main amplifier.

9. The method of claim 8 wherein the selected factor is two.

10. The method of claim 8 wherein the step of digitally, processing the reduced digital audio signal includes limiting the voltage of the reduced digital audio signal to a selected threshold prior to increasing the voltage of the reduced digital audio signal by the selected factor.

* * * * *